United States Patent [19]

Cozzi

[11] Patent Number: 4,467,290
[45] Date of Patent: Aug. 21, 1984

[54] SIGNAL AMPLIFIER WITH WIDE LINEAR DYNAMIC RANGE

[75] Inventor: Gianfranco Cozzi, Rome, Italy

[73] Assignee: Selenia, Industrie Elettroniche Associate, S.p.A., Rome, Italy

[21] Appl. No.: 383,124

[22] Filed: May 28, 1982

[30] Foreign Application Priority Data

May 29, 1981 [IT] Italy ................................ 48580 A/81

[51] Int. Cl.³ ............................ H03F 1/30; H03F 3/04
[52] U.S. Cl. ..................................... 330/290; 330/289; 330/296
[58] Field of Search ............... 330/289, 290, 291, 293, 330/296

[56] References Cited

U.S. PATENT DOCUMENTS 4,028,634  6/1977  Tentarelli ............................ 330/291

Primary Examiner—James B. Mullins
Assistant Examiner—Steven J. Mottola
Attorney, Agent, or Firm—Karl F. Ross

[57] ABSTRACT

A bipolar main transistor $Q_1$ designed to amplify a high-frequency signal applied to its base, for driving a load connected to its collector lead, has its emitter connected through a low-ohmic feedback resistor $R_E$ to a point of stabilized potential constituted by the emitter of a biasing transistor $Q_2$ of the same conductivity type (e.g. NPN) as the main transistor, the latter emitter being connected to a terminal of a d-c supply through a much larger resistor $R_3$; the two series-connected resistors $R_E$, $R_3$ are capacitively shunted for high frequencies. The biasing transistor $Q_2$ is driven at a much larger direct current than the main transistor by a control transistor $Q_3$ traversed by a direct current substantially equaling that of the main transistor $Q_1$, this control transistor being biased by a voltage divider including a fourth transistor $Q_4$ connected as a diode and traversed by a current substantially equaling that of the biasing transistor $Q_2$.

6 Claims, 4 Drawing Figures

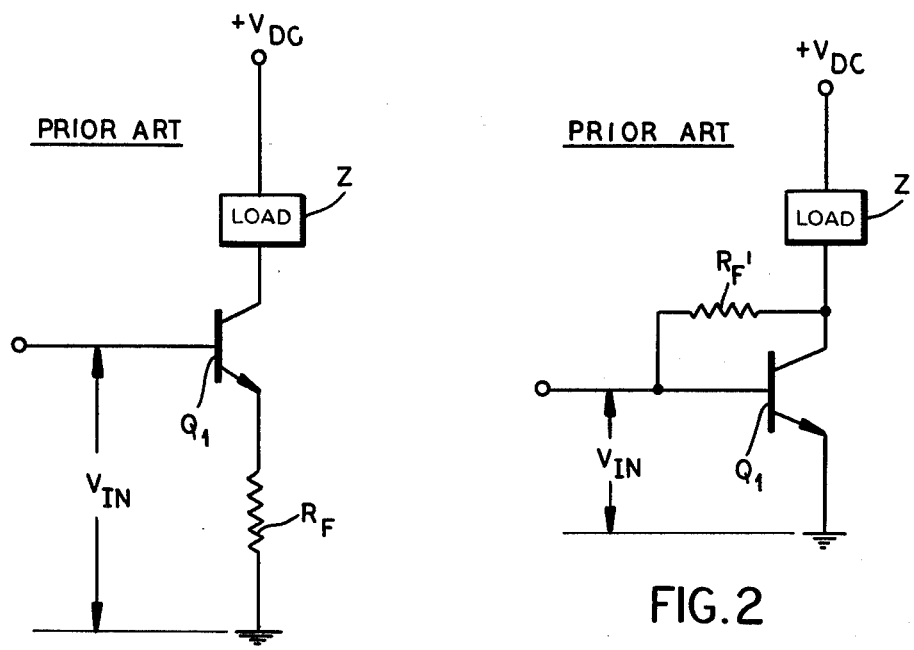
FIG.1
FIG.2
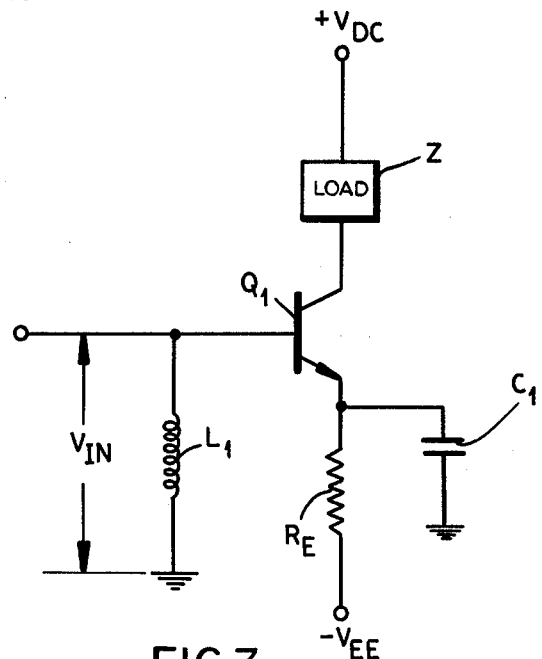
FIG.3

SIGNAL AMPLIFIER WITH WIDE LINEAR DYNAMIC RANGE

FIELD OF THE INVENTION

My present invention relates to an amplifier for high-frequency signals whose principal active component is a solid-state device, specifically a bipolar transistor.

BACKGROUND OF THE INVENTION

When the base of a bipolar transistor operating in the common-emitter mode receives high-frequency signals to be amplified, such as amplitude-modulated radio-frequency carriers, faithful reproduction requires a linear relationship between the amplitudes of the fundamental frequency of the input signal and of the amplified output signal available at a load circuit which is connected to the collector lead of the transistor. Various means are known for increasing the dynamic range within which such linear relationship is maintained. Such means, in general, provide a certain amount of negative feedback in current or voltage. Current feedback, obtained by the insertion of a resistor in the emitter lead of the transistor, establishes an operating point in the middle of the required dynamic range with the aid of a voltage drop generated by a continuous biasing current traversing that resistor; a large feedback resistor, however, significantly reduces the gain of the amplifier stage here considered and thus necessitates a higher gain in a subsequent stage, thereby enhancing the noise figure of the amplifier, whereas a large biasing current directly contributes to that noise figure on account of the so-called "collector term" by a factor increasing with the magnitude of that current and with signal frequency. Voltage feedback, as by the insertion of a resistive connection between the collector and the base, also significantly reduces the gain and worsens the noise figure; moreover, difficulties in realizing a connection of this type (especially in integrated circuitry) makes such an arrangement somewhat impractical.

OBJECT OF THE INVENTION

The object of my present invention, therefore, is to provide a low-noise signal amplifier of wide dynamic range, e.g. as a preamplification stage for radio-frequency signals in a radar or telecommunication system.

SUMMARY OF THE INVENTION

I realize this object, in accordance with my present invention, by the provision of a bipolar amplifying transistor with a base connected to a signal source, a collector connected through a load circuit to one terminal of a direct-current supply, and an emitter connected to the other terminal of that supply through two resistors in series, namely a relatively low-ohmic resistor providing current feedback and a relatively high-ohmic stabilizing resistor whose junction with the feedback resistor is biased to a potential which maintains a substantially constant mean voltage drop across the latter resistor. This biasing potential is established by circuit means connecting the stabilizing resistor across the d-c supply in a direct-current path independent of the amplifying transistor and of the feedback transistor. The two series-connected resistors are shunted by capacitive means forming a bypass for high-frequency signals.

The circuit means serving to establish the aforementioned potential at the junction of the feedback and stabilizing resistors may comprise, pursuant to a more particular feature of my invention, a bipolar biasing transistor of the same conductivity type as the amplifying transistor, this biasing transistor having its collector connected to the first-mentioned terminal and its emitter connected to the other terminal of the d-c supply. The base of the biasing transistor is connected to a control terminal whose potential establishes a current flow through that transistor and through the stabilizing resistor which substantially exceeds the maximum current traversing the amplifying transistor and its feedback resistor.

For the maintenance of a substantially constant mean current flow through the relatively low-ohmic feedback resistor it is also important to take into account changes in ambient temperature affecting the base/emitter voltage of the amplifying transistor. In order to balance these temperature-dependent voltage changes, pursuant to another feature of my invention, the base terminal of the biasing transistor is advantageously connected to the emitter of a bipolar control transistor of the same conductivity type whose collector is connected to the same supply terminal as that of the biasing transistor. The junction of the control-transistor emitter with the biasing-transistor base is connected to the other supply terminal via a further resistor while the base of the control transistor is biased by a voltage divider connected across the d-c supply. That voltage divider preferably comprises an additional bipolar transistor, also of the same conductivity type as the other transistors, whose collector and emitter are connected through respective other resistors to the same supply terminals as those of the biasing and control transistors; the collector and the base of this additional transistor are interconnected in a diode configuration and are joined to the base of the control transistor which, through the aforementioned other resistors forming part of the voltage divider, is maintained conductive with a current flow substantially equaling that of the mean current traversing the amplifying transistor while the additional transistor conducts with a current flow substantially equaling that of the biasing transistor.

In order to maintain the desired temperature compensation, the potential of the base of the biasing transistor ought to be more or less equal to the mean base potential of the amplifying transistor. For this purpose, with the supply terminals balanced with respect to ground, the latter base may be grounded for direct current through an inductance while the base of the biasing transistor is substantially maintained at ground potential.

BRIEF DESCRIPTION OF THE DRAWING

The above and other features of my invention will now be described in detail with reference to the accompanying drawing in which:

FIG. 1 diagrammatically shows a transistor stage of a signal amplifier provided with conventional current feedback;

FIG. 2 is a similar diagram showing such a transistor stage provided with conventional voltage feedback;

FIG. 3 is a diagram similar to that of FIGS. 1 and 2 but showing a transistor stage forming part of an amplifier according to my invention.

SPECIFIC DESCRIPTION

Figure 4:
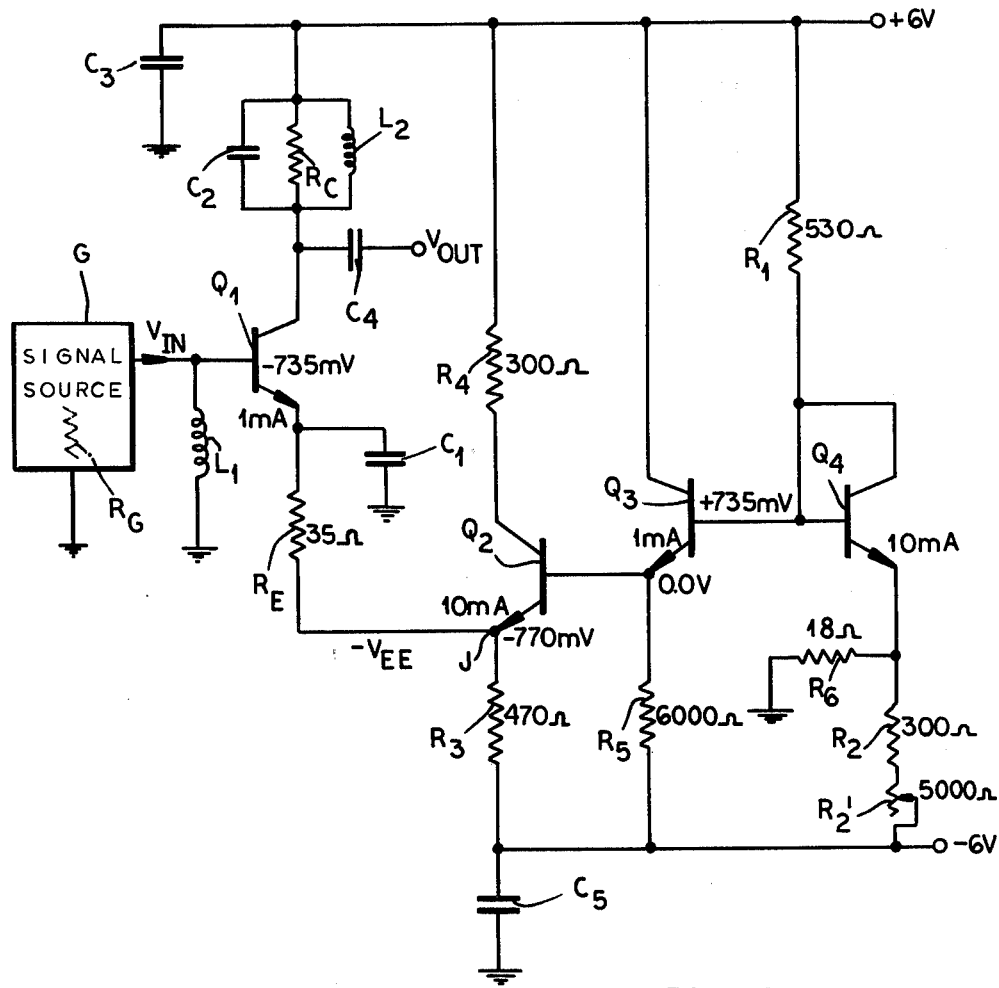
FIG. 4 is a circuit diagram showing the transistor stage of FIG. 3 together with additional amplifier components.

FIG. 1 shows an amplifying transistor $Q_1$ of NPN type having its collector connected through a load circuit Z to a supply of positive voltage $+V_{DC}$, its base connected to a source of input signals $V_{IN}$ and its emitter grounded by way of a resistor $R_F$ providing the aforedescribed negative current feedback. As already explained, the operating point of the transistor at the center of its dynamic range is determined by the voltage drop $I_{DC}\cdot R_F$ across feedback resistor $R_F$; this voltage drop, therefore, must exceed the maximum excursion of the input signal $V_{IN}$ from its mean value. The biasing current $I_{DC}$ and the magnitude of resistor $R_F$ are, however, limited by the above-discussed considerations of amplifier gain and noise figure.

FIG. 2 shows the same transistor $Q_1$ without emitter resistor but with a resistor $R_F$, providing voltage feedback between its collector and its base. The inconveniences of this known arrangement have also been noted above.

FIG. 3 illustrates a mode of connection of transistor $Q_1$ conforming to my present invention. The base of the transistor is here grounded for direct current through an inductance $L_1$ while its emitter is connected through a relatively low-ohmic resistor $R_E$ to a point of stabilized negative voltage $-V_{EE}$. A capacitor $C_1$, connected directly to the emitter of transistor $Q_1$, bypasses high-frequency signals to ground so that resistor $R_E$ essentially provides feedback only for direct current emitted by a supply whose positive terminal generates the voltage $+V_{DC}$. Thus, the operating point of the amplifying transistor now lies at ground potential and the lower limit of the dynamic range is defined in part by voltage $-V_{EE}$.

The distortion introduced by a bipolar transistor such as that shown at $Q_1$, i.e. the departure from linearity between the fundamental components of its input and output signals, can be determined from the following considerations.

Let $I_{si}$ be the inverse-saturation current of the transistor, i.e. the magnitude of its collector current when its base/emitter junction is reverse-biased by a voltage tending toward infinity. The collector current $I_c$ will then substantially correspond to the formula $$I_c = I_{si}(e^{V_{BE}/V_T} - 1)$$

where $V_{BE}$ is the base/emitter voltage and $V_T$ is a temperature-dependent voltage given by $KT/q$, K being Boltzmann's constant, T being the absolute temperature (in degrees Kelvin) and q being the charge of an electron; the value of $V_T$ generally lies between about 25 and 50 mV. With a voltage drop $I_{DC}\cdot R_E > V_{BE}$, the resulting large feedback factor makes the component $I_{DC}$ of the collector current $I_c$ virtually invariable. It can be shown that under these conditions, for an input signal $V_{IN} \approx V_T$ generated by a source with an internal resistance $R_G = 50\Omega$ and a bandwidth of 1 MHz corresponding numerically to a dynamic range of about 83 dB above a noise level of 3 dB, the distortion (i.e. the maximum deviation in the amplitude ratio of the fundamental frequencies of the input and output signals) amounts to substantially $\pm 1$ dB.

If the feedback resistor $R_E$ were completely eliminated, in an effort to extend the dynamic range by relying only on the biasing voltage $-V_{EE}$, difficulties would arise in stabilizing the emitter current and therefore the gain $\alpha$ of the transistor. However, a moderate value of this resistor (generally a few tens of ohms) will allow the maintenance of the maximum deviation of $\pm 1$ dB for input signals $V_{IN} > V_T$.

I have found, and verified it mathematically, that with such a limited feedback resistance an increase in the amplitude of the input signal will at first reduce and thereafter expand the aforementioned amplitude ratio, the expansion being limited by such parameters as the ohmic resistance $R_{EB}$ of the emitter/base junction, the amplification $h_{fc}$ of collector current to base current for small signals, and the generator resistance $R_G$. The emitter/base resistance $R_{EB}$ will be substantially $1\Omega$ with currents up to about 25 mA and will therefore not have much influence upon the linearity of the transistor output. The transfer constant $h_{fc}$ decreases with large collector currents $I_c$, resulting in a somewhat lesser reduction of the gain $\alpha$. The nonlinear increase of the emitter current in response to voltage peaks of the input signal, due to the decrease of that transfer factor, also limits the collector-current peaks on account of the finite generator resistance $R_G$ but, again, only for large signal amplitudes.

The net result of all these phenomena, with the previously given value of $R_G \approx 50\Omega$ and an input level on the order of 0 to 10 dBm, is the achievement of linearity within tolerance limits of $\pm 1$ dB with input signals $V_{IN}$ considerably exceeding the value $V_T$, up to a maximum of 37 $V_T$. A dynamic range of about 110 to 120 dB, surpassing by about 30 dB or more the range realizable with conventional current feedback, can therefore be attained in accordance with my present invention.

The system so far described is susceptible to changes in ambient temperature which varies the base/emitter voltage $V_{BE}$ at a rate of 2 mV per degree K. With an emitter resistance $R_E = 35\Omega$ traversed by a quiescent current of 1 mA, according to the system more particularly described hereinafter with reference to FIG. 4, a change of 10° C. in ambient temperature would entail a current variation of about 0.57 mA which would be excessive.

A more comprehensive circuit arrangement, designed to stabilize the voltage pedestal $-V_{EE}$ and thus the mean current traversing the feedback resistor $R_E$ in the face of varying ambient temperature, has therefore been illustrated in FIG. 4. This Figure shows the same components as FIG. 3 along with a signal source G of internal resistance $R_G$ generating the input voltage $V_{IN}$ e.g. an amplitude-modulated carrier wave of limited bandwidth. The load circuit inserted in the collector lead of amplifying transistor $Q_1$ has been represented by a resistor $R_C$ e.g. of about 1,000$\Omega$, in parallel with an inductance coil $L_2$ and a capacitor $C_2$ which together with a bypass capacitor $C_3$ prevent the transmission of signal frequency to the positive supply terminal here shown to have a nominal potential of +6 V. The load circuit further comprises a coupling capacitor $C_4$ transmitting an output signal $V_{OUT}$ to a nonillustrated receiver therefor, e.g. a further amplifier stage. The other supply terminal, of nominal potential $-6$ V is grounded for high frequencies through a bypass capacitor $C_5$ and is connected to the emitter of transistor $Q_1$ through two series-connected resistors, namely the relatively low-ohmic feedback resistor $R_E$ shown in FIG. 3 and a relatively high-ohmic resistor $R_3$. The junction J of these two resistors is maintained at the stabilized potential $-V_{EE}$ by being connected to the emitter of an NPN biasing transistor $Q_2$ whose collector is connected through a resistor $R_4$ to the positive supply terminal. The same terminal is directly connected to the collector of an NPN control transistor $Q_3$ whose emitter is tied to the base of transistor $Q_2$ and is connected to the negative supply terminal through a resistor $R_5$. An additional NPN transistor $Q_4$, connected as a diode, has its collector and base tied on the one hand to the base of transistor $Q_3$ and on the other hand to one end of a resistor $R_1$ whose other end is connected to the positive supply terminal; the emitter of transistor $Q_4$ is grounded through a small resistor $R_6$ and is connected to the negative supply terminal through a variable resistance comprising a fixed resistor $R_2$ in series with a potentiometer $R_2'$. It will be noted that the two grounded capacitors $C_1, C_5$ effectively lie in series with each other and form a capacitive shunt for high-frequency currents across the two series-connected resistors $R_E$ and $R_3$.

With a mean operating frequency of 30 MHz, capacitors $C_1$ and $C_5$ may have a magnitude of about 1,000 to 10,000 pF. Transistors $Q_1$–$Q_4$ are advantageously of the type available from Phillips under the designation BFR92. Specific values for resistors $R_1$–$R_6$ and $R_E$, indicated in FIG. 4, are as follows:

$R_1 = 530\Omega$
$R_2 = 300\Omega$
$R_2' = 5,000\Omega$
$R_3 = 470\Omega$
$R_4 = 300\Omega$
$R_5 = 6,000\Omega$
$R_6 = 18\Omega$
$R_E = 35\Omega$ With these numerical values, main transistor $Q_1$ and control transistor $Q_3$ are traversed by mean direct currents of 1 mA whereas the currents passing through biasing transistor $Q_2$ and diode-connected transistor $Q_4$ have values of 10 mA, being thus substantially greater than the former. As likewise shown in FIG. 4, the average emitter potential of transistor $Q_1$ is $-735$ mV, the stabilized voltage $-V_{EE}$ at the emitter of transistor $Q_2$ is $-770$ mV, the emitter potential of transistor $Q_3$ applied to the base of transistor $Q_2$ is at ground level 0.0 V, and the base voltage of transistor $Q_3$ established by the voltage divider $R_1, Q_4, R_2, R_2'$ is $+735$ mV (these values are all approximative).

Any variation in ambient temperature will affect not only the main transistor $Q_1$ but also the three ancillary transistors $Q_2$–$Q_4$ which are of the same conductivity type (NPN). The resulting change in current flow will have only a minor effect upon the voltage drop across the relatively low-ohmic feedback resistor $R_E$ but will cause a compensatory change in the voltage drop across the relatively high-ohmic stabilizing resistor $R_3$. A lowering of the base/emitter resistance of biasing transistor $Q_2$ due to such temperature variation, for example, will also be largely counterbalanced by a lowering of its base voltage due to the increased voltage drop across resistor $R_1$ and the corresponding reduction in the conductivity of transistor $Q_3$.

It should be noted that the transistors, the resistors and at least the capacitors $C_1$ and $C_5$ shown in FIG. 4 can be conveniently integrated in hybrid-film or monolithic circuitry so as to form a compact structure in which the temperatures of the several junctions do not significantly differ from one another.

I claim:

1. An amplifier for high-frequency signals, comprising:
    a bipolar amplifying transistor with a base connected to a signal source, a collector connected through a load circuit to one terminal of a direct-currently supply, and an emitter connected to the other terminal of said supply through a relatively low-ohmic resistor adjoining said emitter and through a relatively high-ohmic resistor in series therewith adjoining said other terminal;
    capacitive means shunting said low-ohmic and high-ohmic resistors, thereby forming a bypass for high-frequency signals; and
    circuit means connecting said high-ohmic resistor across said supply in a direct-current path independent of said amplifying transistor and said low-ohmic resistor for biasing the junction of said resistors to an intermediate potential between those of said terminals for maintaining a substantially constant mean voltage drop across said low-ohmic resistor.

2. An amplifier as defined in claim 1 wherein said circuit means comprises a bipolar biasing transistor of the same conductivity type as said amplifying transistor having an emitter connected to said junction, a collector connected to said one terminal, and a base connected to a control terminal whose potential establishes a current flow through said biasing transistor and said high-ohmic resistor substantially exceeding the maximum current traversing said low-ohmic resistor.

3. An amplifier as defined claim 2 wherein said circuit means further comprises a bipolar control transistor, of the same conductivity type as said amplifying and biasing transistors, having a collector connected to said one terminal, an emitter connected through a further resistor to said other terminal and a base biased by a voltage divider connected across said supply, the emitter of said control transistor being connected to the base of said biasing transistor and constituting said control terminal.

4. An amplifier as defined in claim 3 wherein said voltage divider comprises an additional bipolar transistor, of the same conductivity type as said amplifying, biasing and control transistors, with a collector and an emitter connected through respective other resistors to said one and said other terminal and with a base connected to the base of said control transistor and further connected in a diode configuration to the collector of said additional transistor, said other resistors maintaining said control transistor conductive with a current flow substantially equaling the mean current traversing said amplifying transistor and maintaining said additional transistor conductive with a current flow substantially equaling that of said biasing transistor.

5. An amplifier as defined in claim 2, 3 or 4 wherein said one terminal and said other terminal have voltages balanced with reference to ground, the base of said amplifying transistor being grounded for direct current through an inductance, said control terminal being substantially at ground potential.

6. An amplifier as defined in claim 5 wherein said capacitive means comprises a first capacitor, inserted between ground and the emitter of said amplifying transistor, and a second capacitor, inserted between ground and said other terminal.

* * * * *